(12) United States Patent
Hsu et al.

(10) Patent No.: US 11,862,076 B2
(45) Date of Patent: Jan. 2, 2024

(54) LIGHT-EMITTING DIODE DISPLAY MODULE

(71) Applicant: AUO Corporation, Hsinchu (TW)

(72) Inventors: Chung-Hsien Hsu, Hsinchu (TW); Chi-Yu Geng, Hsinchu (TW); Shu-Hao Chang, Hsinchu (TW); Hung-Chi Wang, Hsinchu (TW); Ming-Hung Tu, Hsinchu (TW); Ya-Fang Chen, Hsinchu (TW); Chih-Hsiang Yang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/172,278

(22) Filed: Feb. 21, 2023

(65) Prior Publication Data

US 2023/0282160 A1 Sep. 7, 2023

(30) Foreign Application Priority Data

Mar. 7, 2022 (TW) .................................. 111108265

(51) Int. Cl.
*G09G 3/32* (2016.01)
*H01L 25/075* (2006.01)

(52) U.S. Cl.
CPC ........... *G09G 3/32* (2013.01); *H01L 25/0753* (2013.01); *G09G 2310/0289* (2013.01); *G09G 2310/0291* (2013.01)

(58) Field of Classification Search
CPC .............. G09G 3/32; G09G 2310/0289; H01L 25/0753; H05B 45/46; H05B 47/165
See application file for complete search history.

(56) References Cited

U.S. PATENT DOCUMENTS

| 6,949,972 | B1 * | 9/2005 | Knight | .................... | G05F 3/262 |
| | | | | | 327/543 |
| 2008/0100545 | A1 * | 5/2008 | Hong | .................... | G09G 3/325 |
| | | | | | 345/82 |
| 2008/0258636 | A1 * | 10/2008 | Shih | ....................... | H05B 45/46 |
| | | | | | 315/291 |
| 2012/0327128 | A1 * | 12/2012 | Li | ........................... | G09G 3/32 |
| | | | | | 345/83 |

FOREIGN PATENT DOCUMENTS

| CN | 202160308 | 3/2012 |
| CN | 106940985 | 7/2017 |

* cited by examiner

*Primary Examiner* — Muhammad N Edun
(74) *Attorney, Agent, or Firm* — JCIPRNET

(57) ABSTRACT

Disclosed is a light-emitting diode display module, including a first light-emitting diode, a second light-emitting diode, a third light-emitting diode, a scan block, a voltage conversion block, a first sink block, and a second sink block. An operating voltage of the first light-emitting diode is lower than that of the second and third light-emitting diodes. The voltage conversion block provides an auxiliary power supply voltage based on a high power supply voltage and a low power supply voltage. The first light-emitting diode is coupled between the scan block and the first sink block receiving the high power supply voltage and the auxiliary power supply voltage. The second light-emitting diode and the third light-emitting diode are coupled between the scan block and the second sink block receiving the high power supply voltage and the low power supply voltage.

13 Claims, 4 Drawing Sheets

LIGHT-EMITTING DIODE DISPLAY MODULE

CROSS-REFERENCE TO RELATED APPLICATION

This application claims the priority benefit of Taiwanese application no. 111108265, filed on Mar. 7, 2022. The entirety of the above-mentioned patent application is hereby incorporated by reference herein and made a part of this specification.

BACKGROUND

Technical Field

The disclosure relates to a display module. Particularly, the disclosure relates to a light-emitting diode display module.

Description of Related Art

At present, light-emitting diode display module technology has advantages. In other words, compared with display modules in other forms, a light-emitting diode display module has better performance in terms of energy saving, service lifespan, and safety in use, so light-emitting diode display modules have been widely used at present.

However, light-emitting diodes of different colors use different luminescent materials, and the operating voltages used may be different. As a result, in the design of a color light-emitting diode display module, it is required to refer to the operating voltages of the light-emitting diodes to prevent excessive consumption of the light-emitting diode.

SUMMARY

The disclosure provides a light-emitting diode display module that requires to receive one set of main power supplies. As a result, the light-emitting diode display module may achieve flexibility and space utilization in use, and is not limited by the number of power supplies output by a power supply module.

According to an embodiment of the disclosure, a light-emitting diode display module includes a first light-emitting diode, a second light-emitting diode, a third light-emitting diode, a scan block, a voltage conversion block, a first sink block, and a second sink block. The first light-emitting diode has a first operating voltage and has a first anode and a first cathode. The second light-emitting diode has a second operating voltage and has a second anode and a second cathode. The second operating voltage is greater than the first operating voltage. The third light-emitting diode has the second operating voltage and has a third anode and a third cathode. The scan block receives a high power supply voltage and a low power supply voltage, and is coupled the first anode, the second anode, and the third anode. The voltage conversion block receives the high power supply voltage and the low power supply voltage to provide an auxiliary power supply voltage. The auxiliary power supply voltage ranges from the high power supply voltage to the low power supply voltage. The first sink block receives the high power supply voltage and the auxiliary power supply voltage, and is coupled to the first cathode to drive the first light-emitting diode. The second sink block receives the high power supply voltage and the low power supply voltage, and is coupled to the second cathode and the third cathode to drive the second light-emitting diode and the third light-emitting diode.

Based on the foregoing, in the light-emitting diode display module of the embodiment of the disclosure, based on a high power supply voltage and a low power supply voltage, the voltage conversion block provides an auxiliary power supply voltage ranging from the high power supply voltage to the low power supply voltage, and uses the high power supply voltage and the auxiliary power supply voltage to drive light-emitting diodes having a relatively low operating voltage. Accordingly, the light-emitting diode display module may receive one set of high power supply voltage and low power supply voltage from the power supply module, that is, the power supply module does not require to provide voltages of multiple levels. As a result, the light-emitting diode display module may achieve flexibility and space utilization in use, and is not limited by the number of power supplies output by the power supply module.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Unless otherwise defined, all terms (including technical and scientific terms) used herein have the same meaning as commonly understood by one of ordinary skill in the art related to the disclosure. It will be further understandable that terms, such as those defined in commonly used dictionaries, should be interpreted to have a meaning that is consistent with their meaning in the related art or the context of the disclosure and should not be interpreted in an idealized or overly formal sense unless particularly so defined in the disclosure.

It should be understood that, although terms such as "first", "second", and "third" may be used to describe various elements, members, regions, layers, and/or parts, these elements, members, regions, layers, and/or parts are not limited by these terms. These terms are used only to distinguish one element, member, region, layer, or part from another element, member, region, layer, or part. Accordingly, a first "element", "member", "region", "layer", or "part" in the following description may be termed a second element, member, region, layer, or part without departing from the teachings of the disclosure.

The terminology used herein is for the purpose of describing particular embodiments only and is not intended to be limiting. As used herein, the singular forms "a," "an," and "the" are intended to include the plural forms including "at least one" as well, unless the context clearly indicates otherwise. It will be further understood that the terms "comprise" and/or "include", when used in this specification, specify the presence of stated features, regions, integers, steps, operations, elements, and/or members, but do not preclude the presence or addition of one or more other features, regions, integers, steps, operations, elements, members, and/or combinations thereof.

Figure 1:
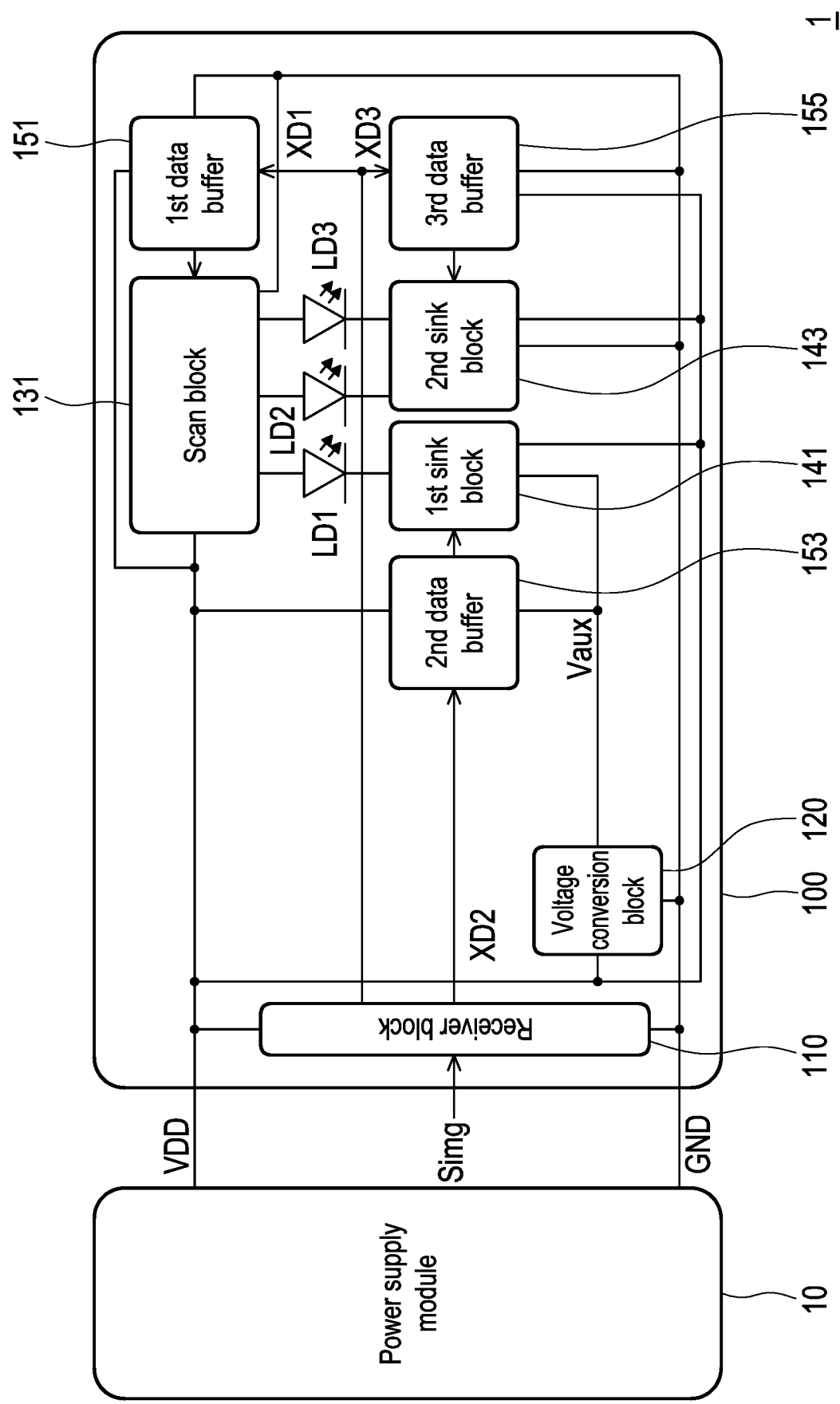
FIG. 1 is a schematic system diagram of a display device including a light-emitting diode display module according to the first embodiment of the disclosure.

FIG. 1 is a schematic system diagram of a display device including a light-emitting diode display module according to the first embodiment of the disclosure. With reference to FIG. 1, in this embodiment, a display device 1 includes a power supply module 10 and a light-emitting diode display module 100. The light-emitting diode display module 100 is coupled to the power supply module 10, and the light-emitting diode display module 100 receives one set of power supplies (e.g., a high power supply voltage VDD and a low power supply voltage GND) from the power supply module 10. Next, the light-emitting diode display module 100 performs conversion into an auxiliary power supply voltage Vaux according to the received one set of power supplies to drive light-emitting diodes having a relatively low operating voltage based on the high power supply voltage VDD and the auxiliary power supply voltage Vaux.

In this embodiment, the light-emitting diode display module 100 includes a receiver block 110, a voltage conversion block 120, a scan block 131, a first sink block 141, a second sink block 143, a first data buffer 151, a second data buffer 153, a third data buffer 155, a first light-emitting diode LD1, a second light-emitting diode LD2, and a third light-emitting diode LD3.

The first light-emitting diode LD1 has a first operating voltage and has a first anode and a first cathode. The second light-emitting diode LD2 has a second operating voltage and has a second anode and a second cathode. The second operating voltage is greater than the first operating voltage. The third light-emitting diode LD3 has the second operating voltage and has a third anode and a third cathode. For example, the first light-emitting diode LD1 is a red light-emitting diode, and the second light-emitting diode LD2 and the third light-emitting diode LD3 are a green light-emitting diode and a blue light-emitting diode.

The scan block 131 receives the high power supply voltage VDD and the low power supply voltage GND, and is coupled to the first anode of the first light-emitting diode LD1, the second anode of the second light-emitting diode LD2, and the third anode of the third light-emitting diode LD3 to provide the high power supply voltage VDD to a corresponding one of the first anode of the first light-emitting diode LD1, the second anode of the second light-emitting diode LD2, and the third anode of the third light-emitting diode LD3 based on a first display data XD1. The voltage conversion block 120 receives the high power supply voltage VDD and the low power supply voltage GND to provide the auxiliary power supply voltage Vaux. The auxiliary power supply voltage Vaux ranges from the high power supply voltage VDD to the low power supply voltage GND.

The first sink block 141 receives the high power supply voltage VDD and the auxiliary power supply voltage Vaux, and is coupled to the first cathode of the first light-emitting diode LD1. Based on a second display data XD2, the first sink block 141 provides the auxiliary power supply voltage Vaux to the first cathode of the first light-emitting diode LD1, and limits the current flowing through the first light-emitting diode LD1 to drive the first light-emitting diode LD1. The second sink block 143 receives the high power supply voltage VDD and the low power supply voltage GND, and is coupled to the second cathode of the second light-emitting diode LD2 and the third cathode of the third light-emitting diode LD3. Based on a third display data XD3, the second sink block 143 provides the low power supply voltage GND to the second cathode of the second light-emitting diode LD2 or the third cathode of the third light-emitting diode LD3, and limits the current flowing through the second light-emitting diode LD2 and the third light-emitting diode LD3 to drive the second light-emitting diode LD2 and the third light-emitting diode LD3.

According to the above, the first sink block 141 driving the first light-emitting diode LD1 provides the auxiliary power supply voltage Vaux to the first cathode of the first light-emitting diode LD1. The auxiliary power supply voltage Vaux is higher than the low power supply voltage GND, thus reducing the provided voltage across the first light-emitting diode LD1 to meet the voltage requirements of the first light-emitting diode LD1. Accordingly, the power consumption and heat of the first light-emitting diode LD1 may be reduced without affecting the driving of the first light-emitting diode LD1.

In addition, since the second sink block 143 still provides the low power supply voltage GND to the second cathode of the second light-emitting diode LD2 or the third cathode of the third light-emitting diode LD3, the second light-emitting diode LD2 or the third light-emitting diode LD3 may still be driven normally without being affected. Moreover, the light-emitting diode display module 100 receives one set of power supplies (e.g., the high power supply voltage VDD and the low power supply voltage GND) from the power supply module 10, that is, the power supply module 10 does not require to provide voltages of multiple levels. As a result, the light-emitting diode display module 100 may achieve flexibility and space utilization in use, and is not limited by the number of power supplies output by the power supply module.

Next, the receiver block 110 receives the high power supply voltage VDD, the low power supply voltage GND, and an image signal Simg, and is coupled to the first data buffer 151, the second data buffer 153, and the third data buffer 155 to provide the first display data XD1, the second display data XD2, and the third display data XD3 based on the image signal Simg. The first data buffer 151 receives the high power supply voltage VDD, the low power supply voltage GND, and the first display data XD1, and is coupled to the scan block 131 to provide the first display data XD1 to the scan block 131.

The second data buffer 153 receives the high power supply voltage VDD, the auxiliary power supply voltage Vaux, and the second display data XD2, and is coupled to the first sink block 141 to provide the second display data XD2 to the first sink block 141. The third data buffer 155 receives the high power supply voltage VDD, the low power supply voltage GND, and the third display data XD3, and is coupled to the second sink block 143 to provide the third display data XD3 to the second sink block 143.

In this embodiment, the receiver block 110 may be a receiver card, and the scan block 131, the first sink block 141, and the second sink block 143 may each be an integrated circuit. In addition, the voltage conversion block 120 may include a DC-to-DC converter to reduce the high power supply voltage VDD to the auxiliary power supply voltage Vaux. Moreover, a sum of the first operating voltage of the first light-emitting diode LD1 and the auxiliary power supply voltage Vaux is equal to a difference between the high power supply voltage VDD and the low power supply voltage GND. For example, assuming that the high power supply voltage VDD is 3.8 volts (V), the low power supply voltage GND is 0 V, if the first operating voltage of the first light-emitting diode LD1 is 3.7 V, the auxiliary power supply voltage Vaux may be 1 V.

Figure 2:
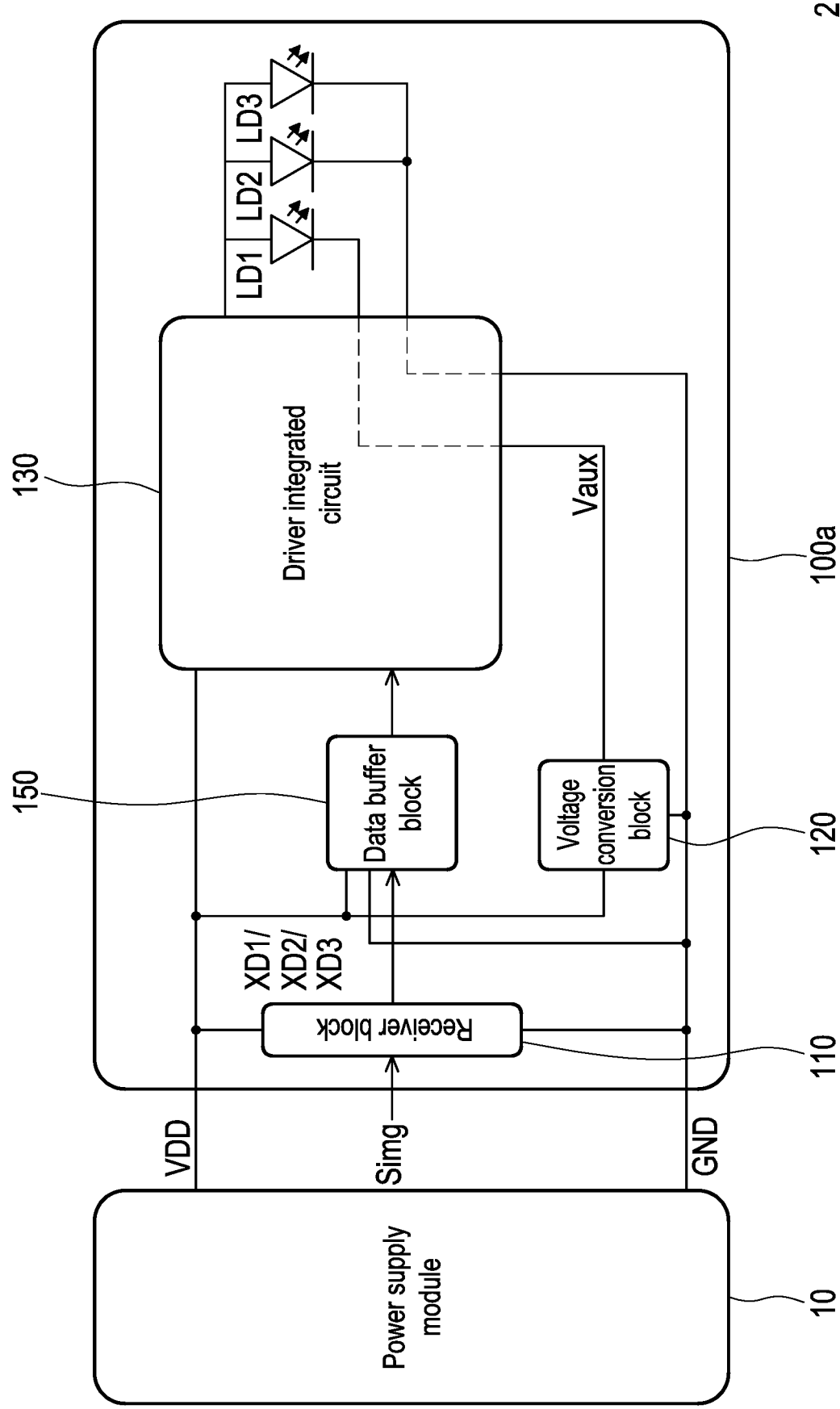
FIG. 2 is a schematic system diagram of a display device including a light-emitting diode display module according to the second embodiment of the disclosure.

FIG. 2 is a schematic system diagram of a display device including a light-emitting diode display module according to the second embodiment of the disclosure. With reference to FIG. 1 and FIG. 2, a display device 2 is substantially the same as the display device 1, and is different in a driver integrated circuit 130 and a data buffer block 150 of a light-emitting diode display module 100a, where the same or similar elements are labeled using the same or similar reference numerals. In this embodiment, the driver integrated circuit 130 may integrate at least the scan block 131, the first sink block 141, and the second sink block 143 shown in FIG. 1, and the data buffer block 150 may integrate at least the first data buffer 151, the second data buffer 153, and the third data buffer 155 shown in FIG. 1.

Figure 3:
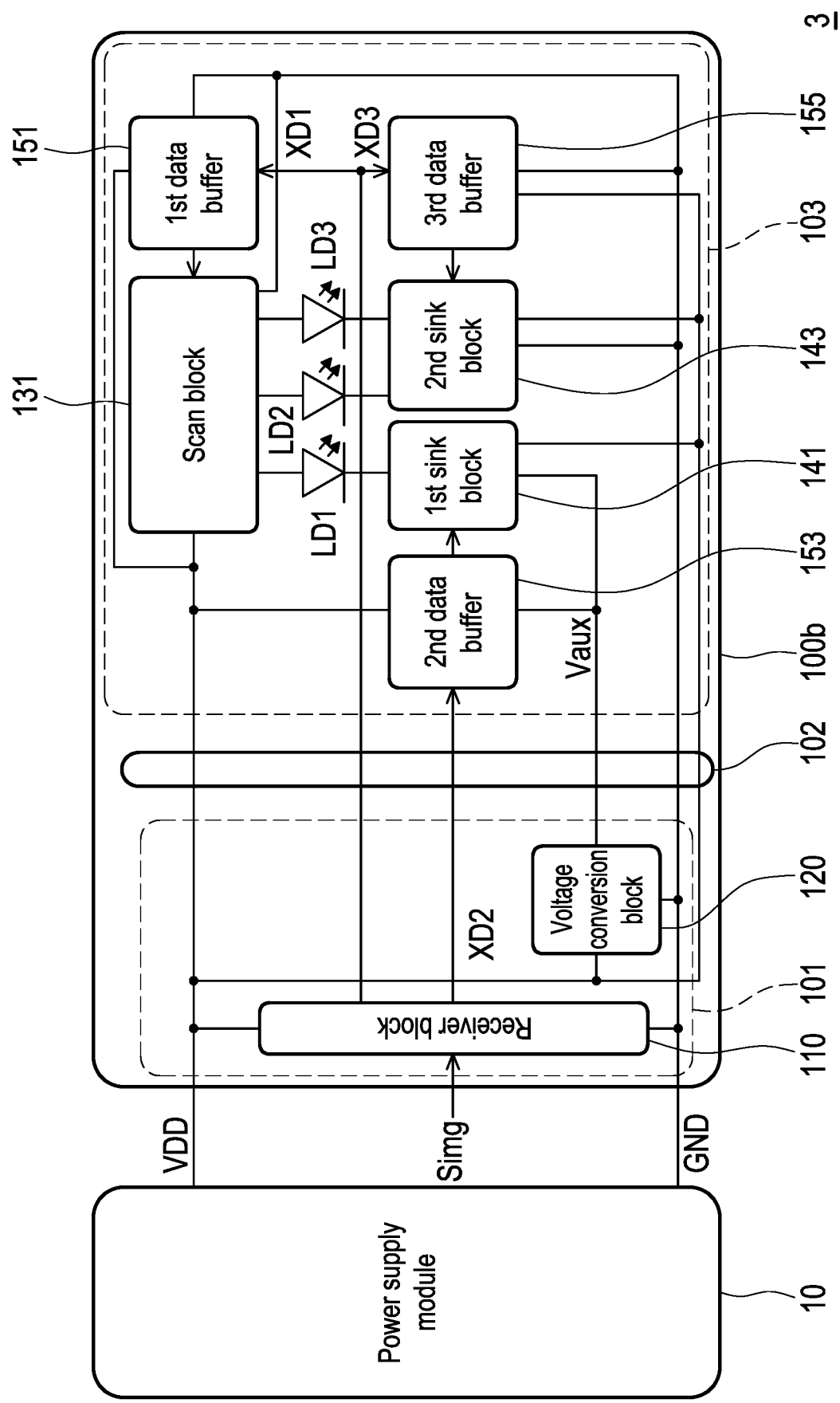
FIG. 3 is a schematic system diagram of a display device including a light-emitting diode display module according to the third embodiment of the disclosure.

FIG. 3 is a schematic system diagram of a display device including a light-emitting diode display module according to the third embodiment of the disclosure. With reference to FIG. 1 and FIG. 3, a display device 3 is substantially the same as the display device 1, and is different in a motherboard 101, a connecting port 102, and a light board 103 of a light-emitting diode display module 100b, where the same or similar elements are labeled using the same or similar reference numerals. In this embodiment, the receiver block 110 and the voltage conversion block 120 are disposed on the motherboard 101 (i.e., the control board) of the light-emitting diode display module 100b, and the first light-emitting diode LD1, the second light-emitting diode LD2, the third light-emitting diode LD3, the scan block 131, the first sink block 141, the second sink block 143, the first data buffer 151, the second data buffer 153, and the third data buffer 155 are disposed on the light board 103 of the light-emitting diode display module 100b. Moreover, the motherboard 101 and the light board 103 are bonded to each other through the connecting port 102. The number of the motherboard 101 and the number of the light board 103 are determined depending on the circuit design.

Figure 4:
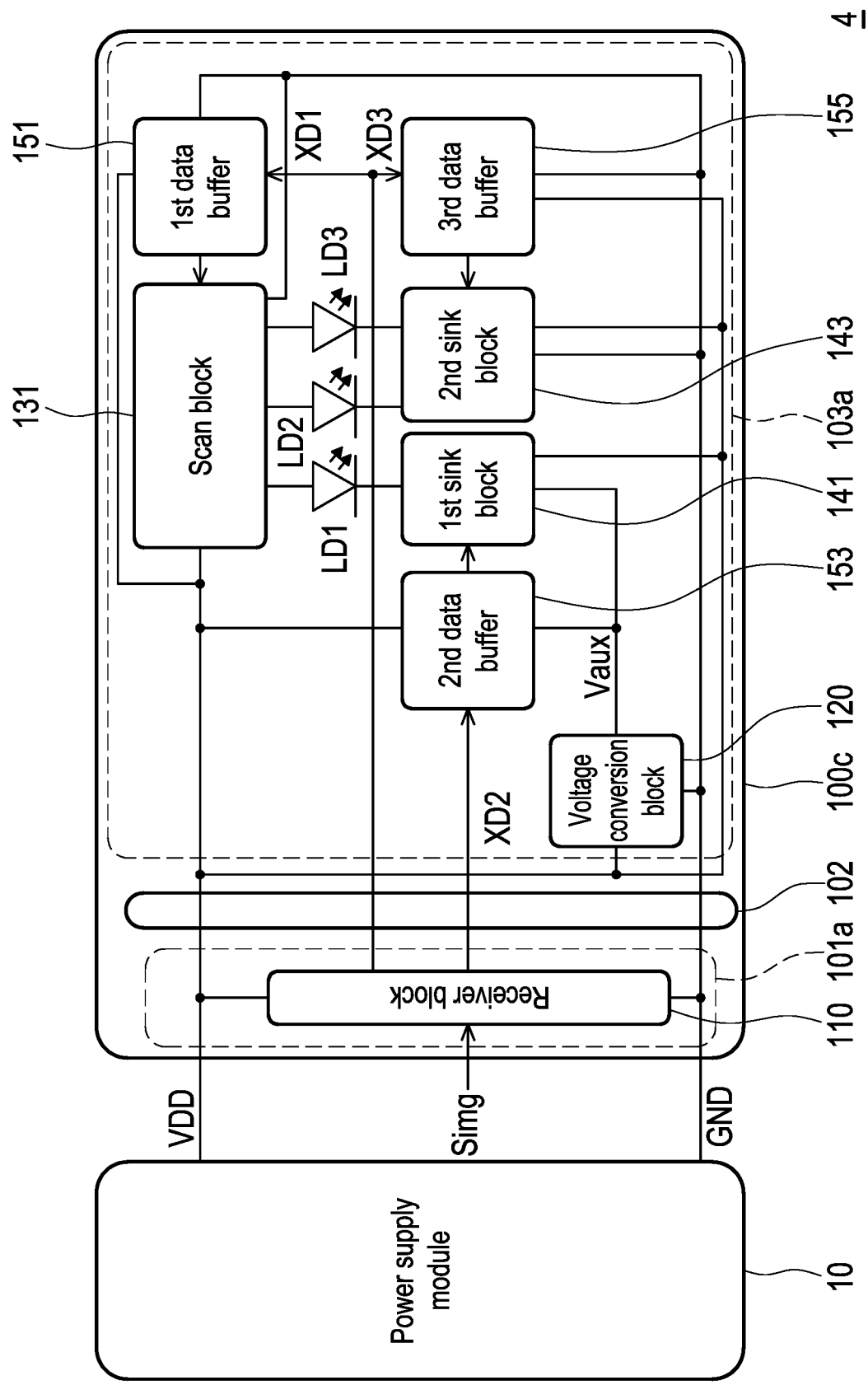
FIG. 4 is a schematic system diagram of a display device including a light-emitting diode display module according to the fourth embodiment of the disclosure.

FIG. 4 is a schematic system diagram of a display device including a light-emitting diode display module according to the fourth embodiment of the disclosure. With reference to FIG. 1 and FIG. 3, a display device 4 is substantially the same as the display device 1, and is different in a motherboard 101a, the connecting port 102, and a light board 103a of a light-emitting diode display module 100c, where the same or similar elements are labeled using the same or similar reference numerals. In this embodiment, the receiver block 110 is disposed on the motherboard 101a of the light-emitting diode display module 100c, and the voltage conversion block 120, the first light-emitting diode LD1, the second light-emitting diode LD2, the third light-emitting diode LD3, the scan block 131, the first sink block 141, the second sink block 143, the first data buffer 151, the second data buffer 153, and the third data buffer 155 are disposed on the light board 103a of the light-emitting diode display module 100c. Moreover, the motherboard 101a and the light board 103a are bonded to each other through the connecting port 102. The number of the motherboard 101a and the number of the light board 103a are determined depending on the circuit design.

In summary of the foregoing, in the light-emitting diode display module of the embodiment of the disclosure, based on a high power supply voltage and a low power supply voltage, the voltage conversion block provides an auxiliary power supply voltage ranging from the high power supply voltage to the low power supply voltage, and uses the high power supply voltage and the auxiliary power supply voltage to drive light-emitting diodes having a relatively low operating voltage. Accordingly, the light-emitting diode display module may receive one set of power supplies (e.g., the high power supply voltage and the low power supply voltage) from the power supply module, that is, the power supply module does not require to provide voltages of multiple levels. As a result, the light-emitting diode display module may achieve flexibility and space utilization in use, and is not limited by the number of power supplies output by the power supply module.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting diode display module, comprising:
   a first light-emitting diode, having a first operating voltage and having a first anode and a first cathode;
   a second light-emitting diode, having a second operating voltage and having a second anode and a second cathode, wherein the second operating voltage is greater than the first operating voltage;
   a third light-emitting diode, having the second operating voltage and having a third anode and a third cathode;
   a scan block, receiving a high power supply voltage and a low power supply voltage, and being coupled the first anode, the second anode, and the third anode;
   a voltage conversion block, receiving the high power supply voltage and the low power supply voltage to provide an auxiliary power supply voltage, wherein the auxiliary power supply voltage ranges from the high power supply voltage to the low power supply voltage;
   a first sink block, receiving the high power supply voltage and the auxiliary power supply voltage, and being coupled to the first cathode to drive the first light-emitting diode; and
   a second sink block, receiving the high power supply voltage and the low power supply voltage, and being coupled to the second cathode and the third cathode to drive the second light-emitting diode and the third light-emitting diode.

2. The light-emitting diode display module according to claim 1, further comprising:
   a first data buffer, receiving the high power supply voltage, the low power supply voltage, and a first display data, and being coupled to the scan block to provide the first display data to the scan block;
   a second data buffer, receiving the high power supply voltage, the auxiliary power supply voltage, and a second display data, and being coupled to the first sink block to provide the second display data to the first sink block; and
   a third data buffer, receiving the high power supply voltage, the low power supply voltage, and a third display data, and being coupled to the second sink block to provide the third display data to the second sink block.

3. The light-emitting diode display module according to claim 2, further comprising a receiver block, configured to receive an image signal, and providing the first display data, the second display data, and the third display data based on the image signal.

4. The light-emitting diode display module according to claim 3, wherein the receiver block is a receiver card.

5. The light-emitting diode display module according to claim 3, wherein the receiver block and the voltage conversion block are disposed on a motherboard of the light-emitting diode display module, and the first light-emitting diode, the second light-emitting diode, the third light-emitting diode, the scan block, the first sink block, the second sink block, the first data buffer, the second data buffer, and the third data buffer are disposed on a light board of the light-emitting diode display module.

6. The light-emitting diode display module according to claim 5, wherein the motherboard and the light board are bonded to each other through a connecting port.

7. The light-emitting diode display module according to claim 3, wherein the receiver block is disposed on a motherboard of the light-emitting diode display module, and the voltage conversion block, the first light-emitting diode, the second light-emitting diode, the third light-emitting diode, the scan block, the first sink block, the second sink block, the first data buffer, the second data buffer, and the third data buffer are disposed on a light board of the light-emitting diode display module.

8. The light-emitting diode display module according to claim 3, wherein the scan block, the first sink block, and the second sink block are integrated into a driver integrated circuit.

9. The light-emitting diode display module according to claim 8, wherein the first data buffer, the second data buffer, and the third data buffer are integrated into a data buffer block.

10. The light-emitting diode display module according to claim 3, wherein the scan block, the first sink block, and the second sink block are each an integrated circuit.

11. The light-emitting diode display module according to claim 1, wherein the voltage conversion block comprises a DC-to-DC converter.

12. The light-emitting diode display module according to claim 1, wherein the first light-emitting diode comprises a red light-emitting diode, and the second light-emitting diode and the third light-emitting diode respectively comprise a green light-emitting diode and a blue light-emitting diode.

13. The light-emitting diode display module according to claim 1, wherein a sum of the first operating voltage and the auxiliary power supply voltage is equal to a difference between the high power supply voltage and the low power supply voltage.

* * * * *